(12) United States Patent
Lu et al.

(10) Patent No.: US 12,334,377 B2
(45) Date of Patent: Jun. 17, 2025

(54) CHIPLET LOADER FOR MICROASSEMBLER

(71) Applicant: PALO ALTO RESEARCH CENTER INCORPORATED, Palo Alto, CA (US)

(72) Inventors: JengPing Lu, Fremont, CA (US); David K. Biegelsen, Portola Valley, CA (US); Sourobh Raychaudhuri, Mountain View, CA (US); Bradley Rupp, Palo Alto, CA (US); Eugene M. Chow, Palo Alto, CA (US)

(73) Assignee: Xerox Corporation, Norwalk, CT (US)

( * ) Notice: Subject to any disclaimer, the term of this patent is extended or adjusted under 35 U.S.C. 154(b) by 340 days.

(21) Appl. No.: 18/097,543

(22) Filed: Jan. 17, 2023

(65) Prior Publication Data
US 2024/0242993 A1    Jul. 18, 2024

(51) Int. Cl.
*H01L 21/677* (2006.01)

(52) U.S. Cl.
CPC .. *H01L 21/67721* (2013.01); *H01L 21/67736* (2013.01)

(58) Field of Classification Search
USPC .......................................................... 406/82
See application file for complete search history.

(56) References Cited

U.S. PATENT DOCUMENTS

| | | |
|---|---|---|
| 6,790,425 B1 | 9/2004 | Smalley et al. |
| 7,080,444 B1 * | 7/2006 | Craig ............... H01L 21/67144 257/E21.705 |
| 8,535,553 B2 | 9/2013 | Kong et al. |
| 9,024,300 B2 | 5/2015 | Voutilainen et al. |
| 9,473,047 B2 | 10/2016 | Thompson et al. |
| 9,927,804 B2 * | 3/2018 | Raychaudhuri .... G05B 19/4142 |
| 10,242,892 B2 | 3/2019 | Chang et al. |
| 10,446,532 B2 | 10/2019 | Uzoh et al. |
| 10,926,521 B2 | 2/2021 | Lu et al. |

(Continued)

FOREIGN PATENT DOCUMENTS

CN    106876532 A    6/2017

OTHER PUBLICATIONS

Masubuchi et al., "Autonomous robotic searching and assembly of two-dimensional crystals to build van der Waals supertattices", Nature Communications 9:1413, 2018, pp. 1-12.

(Continued)

*Primary Examiner* — William R Harp
(74) *Attorney, Agent, or Firm* — Mueting Raasch Group

(57) ABSTRACT

A micro-assembly system includes a reservoir that stores a supply of chiplets suspended in a suspension fluid. Each of the chiplets has a bottom major surface that defines a right side down orientation. The system includes a delivery surface or belt that delivers the chiplets from the reservoir to an assembly surface. The system includes a micro assembler that may arrange the first subset of the chiplets in a pattern on the assembly surface. The micro assembler moves the first subset of chiplets towards a subsequent assembly stage. The micro assembler has an array of field generators fixed relative to the assembly surface that move the first subset of the chiplets along the assembly surface in response to signals applied to each of the field generators.

19 Claims, 7 Drawing Sheets

(56) References Cited

U.S. PATENT DOCUMENTS

| | | |
|---|---|---|
| 11,302,554 B2 | 4/2022 | Lu et al. |
| 2010/0021708 A1 | 1/2010 | Kong et al. |
| 2011/0279014 A1 | 11/2011 | Winters et al. |
| 2016/0281256 A1 | 9/2016 | Freer et al. |

OTHER PUBLICATIONS

Novoselov et al., "2D materials and van der Waals heterostructures", Science, vol. 353, Issue 6298, Jul. 29, 2016, 13 pages.

* cited by examiner

CHIPLET LOADER FOR MICROASSEMBLER

SUMMARY

The present disclosure is directed to a chiplet loader for a microassembler. In one embodiment, system includes a reservoir that stores a supply of chiplets suspended in a suspension fluid. Each of the chiplets has a bottom major surface that defines a right side down orientation. The system includes a delivery surface forming a path to deliver the chiplets from the reservoir to an assembly surface. A sensor of the system identifies a first subset of the chiplets having the respective bottom surfaces facing the assembly surface. The system includes a micro assembler that arranges the first subset of the chiplets in a pattern on the assembly surface and moves the first subset of chiplets towards a subsequent assembly stage. The micro assembler has an array of field generators fixed relative to the assembly surface that move the first subset of the chiplets along the assembly surface in response to signals applied to each of the field generators.

In another embodiment, a system includes a reservoir storing a supply of chiplets suspended in a suspension fluid. Each of the chiplets has a bottom major surface that defines a right side down orientation. The system includes a moving belt delivers the chiplets from the reservoir to an assembly surface. The moving belt includes features that arranges the chiplets in a pattern. A micro assembler of the system moves a first subset of the chiplets that are in the right side down orientation to a subsequent assembly stage.

These and other features and aspects of various embodiments may be understood in view of the following detailed discussion and accompanying drawings.

BRIEF DESCRIPTION OF THE DRAWINGS

The discussion below makes reference to the following figures, wherein the same reference number may be used to identify the similar/same component in multiple figures. The drawings are not necessarily to scale.

DETAILED DESCRIPTION

The present disclosure relates to manipulation and assembly of objects, and in some embodiments the mass assembly of micro-objects. Some electronic devices are fabricated by mechanically overlaying small objects on top of each other. While micro-electronic and micro-optical components are sometimes manufactured using wafer formation techniques such as layer deposition, masking, and etching, certain classes of materials are not growth-compatible with each other. In such a case, the assembly may involve forming one class of devices on a first substrate and a second class of devices on a second substrate, and then mechanically joining them, e.g., via flip-chip or transfer printing techniques.

Aspects described herein relate to a system that is capable of transferring large number of micro objects (e.g., particles, chiplets, mini/micro-LED dies) from a donor substrate to another substrate in parallel while maintaining high position registration of the individual micro objects. This system allows arranging large numbers of micro objects into patterns, where they can be mass transferred to a destination or target substrate. This system may be used for assembling devices such as microLED displays in some embodiments. In other embodiments, these techniques can be used to mass-produce devices using van der Waals materials or two-dimensional (2-D) materials, e.g., graphene.

In order to mass-produce devices using micro objects, automated systems are used, among other things, to manufacture an array of micro devices on a substrate or the like, divide the substrate into individual units of the desired size, and move the units into a desired location and orientation, and then manipulate the units to form an assembly. Methods and apparatuses are described herein that can be used to hold the materials that are separated into individual units (referred to herein as 'chiplets') and move the chiplets into a desired location, e.g., a grid that allows the chiplets to be picked up for further processing.

Figure 1:
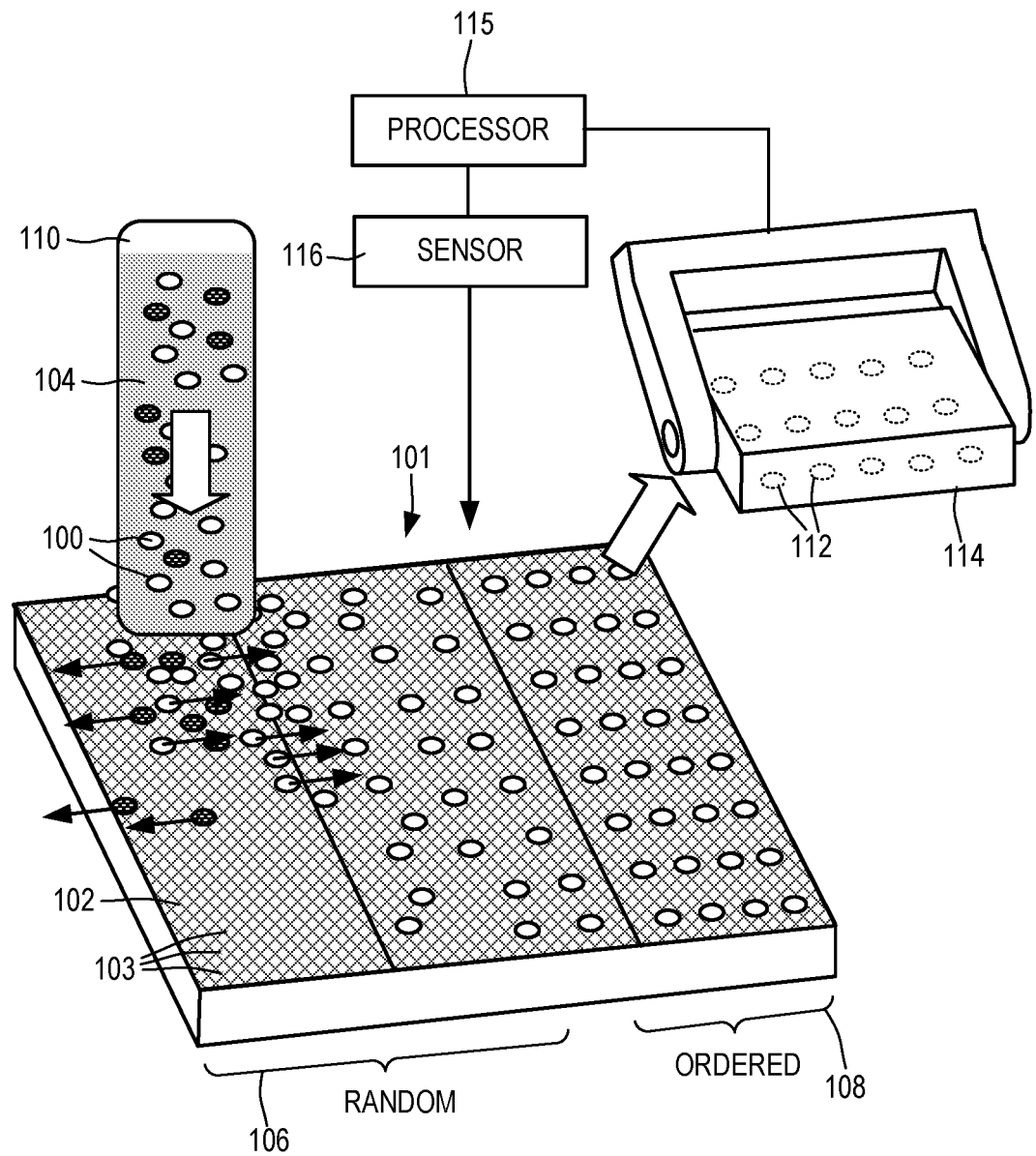
FIG. 1 is a diagram showing an assembly process according to an example embodiment.

In FIG. 1, a diagram shows an example of an assembly system according to an example embodiment. As seen in FIG. 1, chiplets 100 may be transported to an assembly surface 102, e.g., via a carrier fluid 104 (such as isopar) that is on a delivery surface 110. On the assembly surface 102, the chiplets 100 are selected, sorted, oriented and arranged. When first moved onto the assembly surface 102, the chiplets may be disordered, e.g., randomly arranged. The assembly surface 102 is part of a micro assembler 101 that utilizes actuators 103, e.g., electrodes, piezo actuators, magnets, etc., that can cause the chiplets 100 to be moved from a disordered (e.g., random) location and orientation at region 106 to ordered locations and orientations at region 108.

The actuators 103 (which may be located elsewhere besides the assembly surface 102) may use any combination of electrostatic forces, magnetic forces, acoustics waves, physical forces, fluidic actuation, etc., to move and orient the chiplets 100 to the ordered locations. Thus, while the actuators 103 are fixed relative to the assembly surface, movement of chiplets 100 can be induced by a changing signals applied to the array of actuators 103. As indicated by processor 115 and sensor 116, the micro assembler 101 can automatically sense orientations of the chiplets 100 and cause the actuators to gradually move the chiplets 100 across the assembly surface 102 to the desired locations and orientations by shifting fields in a particular direction. A description of features associated with such a micro assembler can be found in U.S. Pat. No. 11,302,554 dated Apr. 12, 2022 and U.S. Pat. No. 10,926,521 dated Feb. 23, 2021, both of which are hereby incorporated by reference.

The ordered locations in this example are a grid pattern that matches that of mildly adhesive protrusions 112 of a transfer head 114. Other transfer mechanisms may be used to remove the chiplets 100 from the assembly surface 102 besides a transfer head 114. Nonetheless, most transfer mechanisms may be configured to pick up the chiplets 100 in a predetermined pattern, which may include rows, a rectangular grid pattern, an offset row pattern (e.g., honeycomb type arrangement), a radial pattern, etc.

The chiplets 100 are loaded onto the micro assembler surface 102 before being manipulated into final positions before transfer. The chiplets 100 may be provided at ordered region 108 right side up, in approximately proper registration, a line at a time for example. For example, the chiplets 100 may have electrical bonding features (e.g., pads) on one side or some other feature that precludes assembly in an arbitrary orientation of their major surfaces, thus defines a right side up (also referred to herein as right side down) orientation of the chiplets 100.

In FIG. 1, chiplets 100 that are not in the right side up orientation are shaded. As indicated by the arrows, the non-shaded chiplets 100 that are in the right side up orientation are moved to the right in the figure, while the shaded chiplets 100 that are not in the right side up orientation are moved to the left where they can be recycled, for example. In embodiments described below, various means are described for ensuring right side up orientation of chiplets 100.

The lines of chiplets 100 can be positioned in region 108 for eventual registration and transfer by the micro assembler 101. For heterogeneous chiplet assembly the various chiplets 100 can be provided with separate deliveries for each variety, but in such a case the heterogenous varieties can be supplied a line at a time with desired chiplets already in their relative positions.

The micro assembler 101 sits within a larger manufacturing process in which large numbers of chiplet or chiplet-like components are manufactured and divided into individual devices, large numbers of the chiplets 100 being held in a reservoir or the like being queued up to be arranged on the assembly surface 102. The system that receives and holds the chiplets 100 and meters them out for delivery to the micro assembler 101 is referred to herein as an autoloader. The autoloader will generally be able to store a large amount of chiplets (e.g., in a liquid suspension) and deposit a manageable density of chiplets to the surface 102 of the micro assembler 101, where they can be moved, sorted, and arranged by a dynamic electrode array or other actuator. The autoloader may also have features for recirculating the chiplets which do not show the correct side up or down to the assembly surface 102. The delivery surface 110 in FIG. 1 may be considered part of an autoloader system or subsystem.

Figure 2:
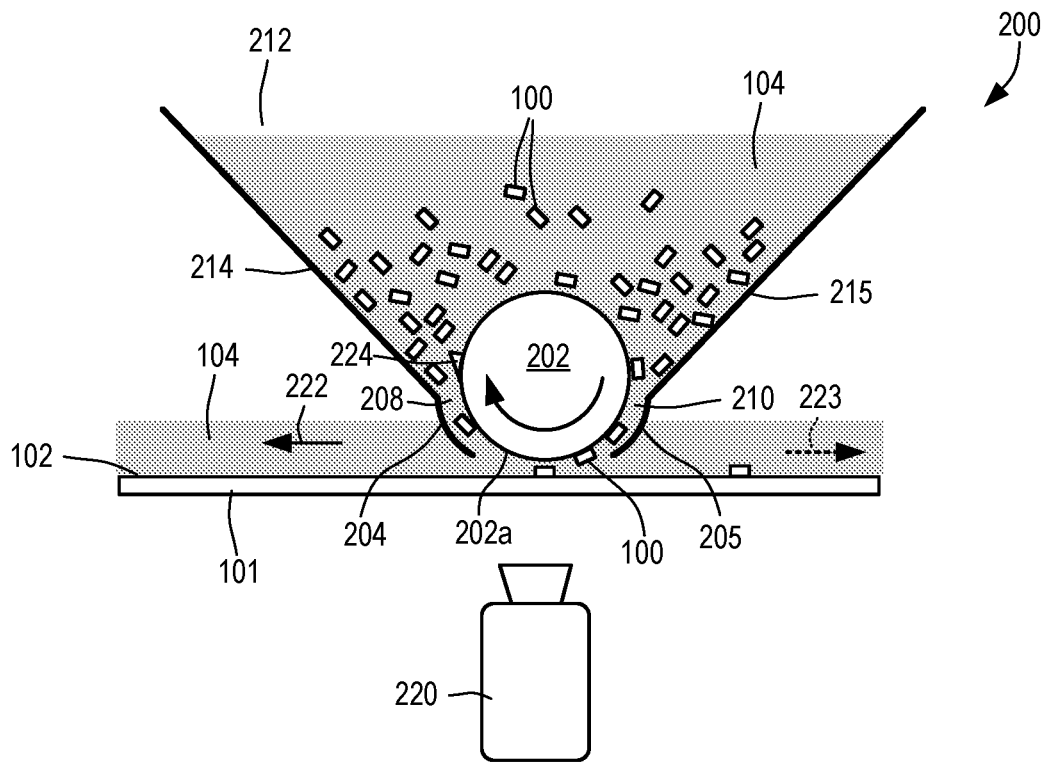
FIGS. 2 and 3 are side views showing autoloaders according to example embodiments.

In FIG. 2, a diagram shows an autoloader system 200 according to an example embodiment. A rotating cylinder 202 extends perpendicular to the drawing plane and is surrounded by surfaces 204, 205. Gaps 208, 210 between the cylinder 202 and the surfaces 204, 205 forms a flow path through which the chiplets 100 are delivered to the micro assembler surface 102. A reservoir 212 holds the chiplets 100 suspended in the carrier fluid 104 where they are directed towards the cylinder 202, e.g., via gravity and/or an internal flow in the reservoir 212. The chiplets 100 are carried by an outer surface 202a of the cylinder 202, which may be considered a delivery surface. Sloped sides 214, 215 of the reservoir 212 join with the delivery surfaces 204, 205, which may force the chiplets 100 into a desired orientation, e.g., having their major surfaces tangent to an outer surface of the cylinder 202.

The cylinder 202 can be program controlled in sync with software that drives the micro assembler 101. The rotating cylinder 202 creates a dielectric fluid flow near the assembly surface 102 with a flow profile of fluid velocity equal to cylinder surface velocity at the cylinder surface and dropping to zero at the assembly surface 102. The fluid flow gradient should be such that it is able to shear the chiplets 100 such that they do not stack with each other. The chiplets 100 will move with the fluid 104, driven close to the assembly surface 102 by centrifugal force but might be levitated by the Bernoulli effect. The fluid level outside the autoloader 200 can be at a different level than inside by balancing hydrostatic fluid pressure and Bernoulli effect.

The system includes a sensor, e.g., a camera 220, that can detect the location and orientation of the chiplets 100 at or near the micro assembler 101. The camera 220 or other sensor can also identify whether or not the chiplets 100 are oriented right side up or not. When the feedback camera detects a chiplet 100 with right side down, the program will activate the corresponding electrodes (or other actuator) to create electrode static field (or other field), pulling down and grabbing the chiplet 100. The micro assembler 101 advances the chiplets 100 under program control, e.g., moving the chiplet 100 along the assembly surface 102 in direction 222 to be arranged and aligned as described above.

Those chiplets 100 that are not in the right side down orientation (wrong side down) may be moved back into the reservoir by the cylinder 202. For example, if the cylinder 202 moves in the direction indicated by the curved arrow, gap 208 will act as an inlet path (relative to the reservoir 212) and the gap 210 will be an outlet path. Once chiplets leave the outlet path, they may naturally release from the cylinder surface 202a due to fluid forces. In some embodiments, a skimmer blade 224 or the like may be placed near the outlet path to release any remaining chiplets 100.

Although the micro assembler 101 may be set up to pull only right side down oriented chiplets 100 from the cylinder 202, a wrongly-oriented chiplet 100 may still fall or be dislodged from the cylinder 202 and end up on the assembly surface 102. In such an event, the wrongly-oriented chiplet 100 can be detected by the camera 220 and a controller will activate the assembly surface 102 to move these chiplets 100 in a different direction 223 from where the right side down chiplets 100 are sent. In one or more other embodiments, all the chiplets 100 may be offloaded from the cylinder 202 regardless of orientation (e.g., using a skimmer blade) and then moved in respective directions 222, 223 based on their major surface orientation. Chiplets 100 sent in direction 223 can be collected and placed back in the reservoir 212.

The cylinder 202 is program controllable to stop, go, and reverse to affect the feed speed and/or direction. This can also be used to dislodge chiplets 100 that may become stuck, e.g., at the interfaces between the sloped sides 214, 215 and the delivery surfaces 204, 205. In one or more embodiments, the axis of the cylinder 202 can be translatable, e.g., vertically or horizontally, such that a pumping action can be achieved to further reduce the possibility of a chiplet log jam. Furthermore, if the roller is closer to the inlet wall than the outlet wall, a vertical motion of the roller axis will more readily clear downstream aggregations.

Figure 3:
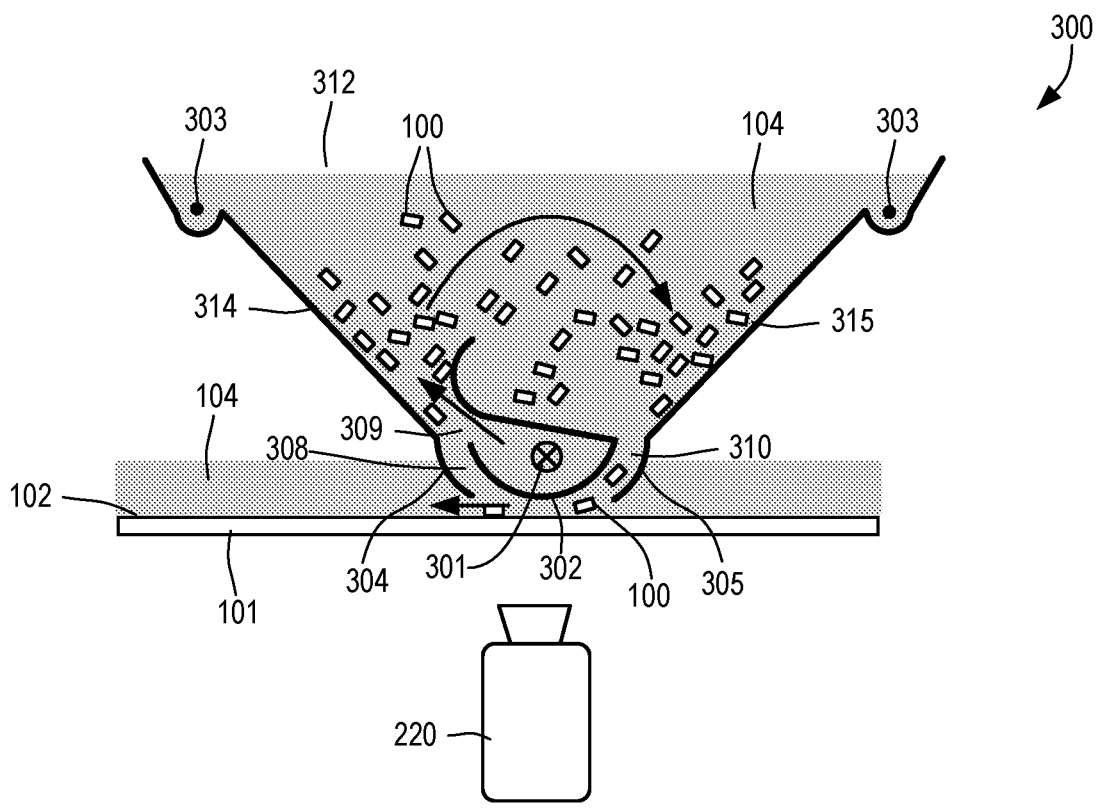

In FIG. 3, a diagram shows an autoloader system 300 according to another example embodiment. Instead of a rotating cylinder, this example uses fluid flow induced by Venturi pumping to deliver chiplets 100 to the assembly surface 102. As with the previous example, a reservoir 312 has sloped sides 314, 315 that join with outer surfaces 304, 305. Flow paths 308, 310 are between and inner flow surface 302 and outer surfaces 304, 305 and deliver the chiplets 100 to the micro assembler surface 102. The inner flow surface 302 and outer flow surfaces 304, 305 may all be considered delivery surfaces for purposes of this example. For example, the shape, size, fluid properties, flow rate, etc., may cause chiplets 100 to preferentially move along one or more of these surfaces 302, 304, 305.

In this example, the fluid 104 is taken out of the system at the top, as indicated by fluid sinks 303 which moves fluid, e.g., out of the drawing plane. The flow is pressurized by a fluid source 301. Any compatible fluid pump can provide pressure for the fluid source 301, pushing fluid into the reservoir 312 and creating a high velocity fluid flow at a Venturi jet nozzle 309. Flow through the nozzle 309 induces fluid flow to drag chiplets 100 circulating to the assembly surface 102 via outlet flow path 310. Once chiplets are proximate the assembly surface 102, they can be captured and sorted via the micro assembler 101 and camera 220 or other sensor. This may include any of the techniques described the embodiment shown in FIG. 2, such as selective capture of right side down chiplets 100 onto the assembly surface 102 or capture of all chiplets 100 and then movement of right and wrong side down chiplets 100 in different directions. Note that the sinks 303 are placed high up in the reservoir sufficiently far away from the fluid source 301 to prevent the circulating chiplets 100 from entering into the fluid pumping subsystem.

Figure 4:
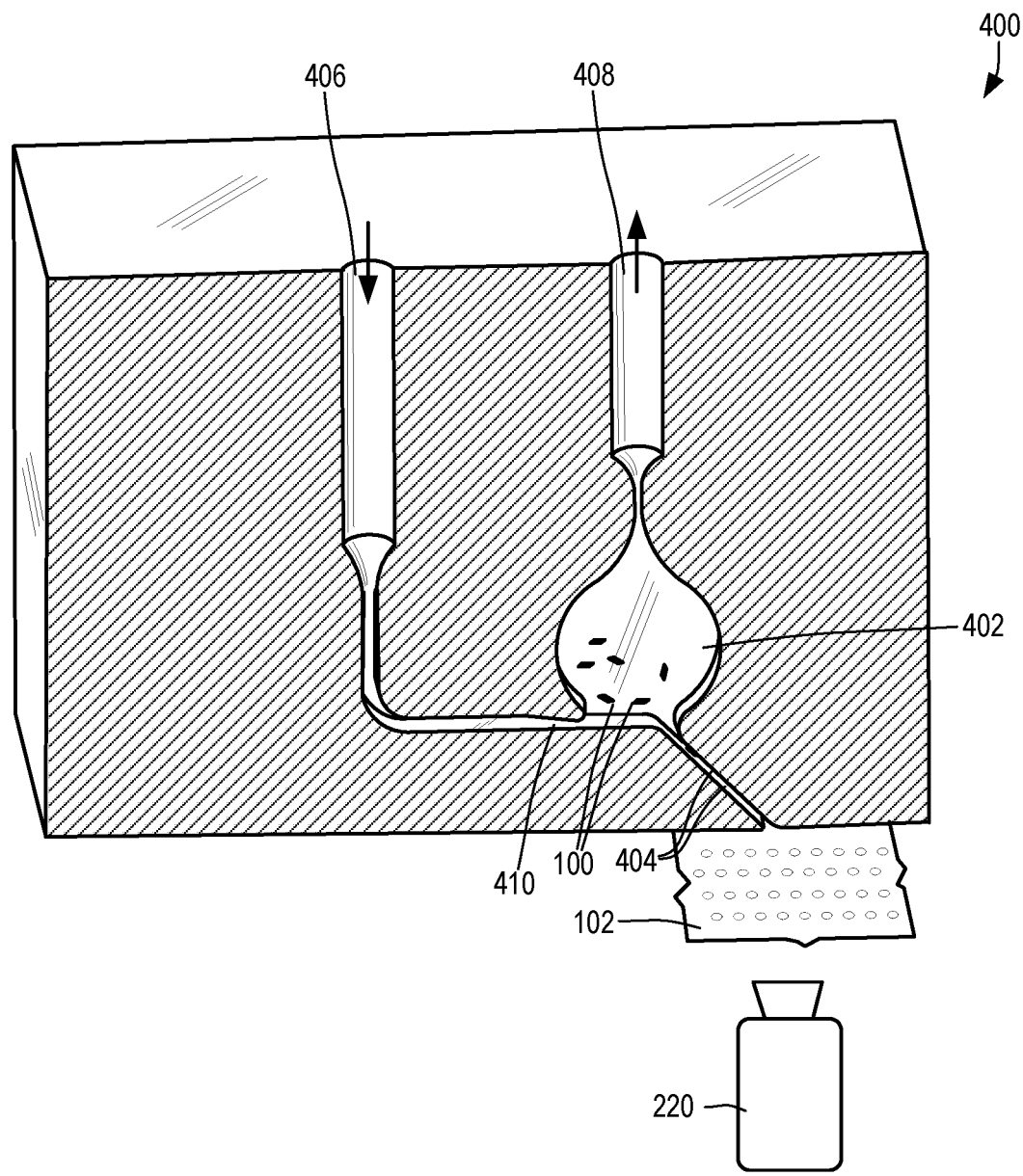
FIG. 4 is a cross-sectional view showing a Venturi flow autoloader according to an example embodiment.

In FIG. 4, a cutaway view shows an autoloader system 400 according to another example embodiment, which also uses Venturi pumping. A reservoir 402 has sides that join with delivery surfaces 404. A fluid inlet 406 (also referred to as a fluid source) receives pressurized liquid which passes through a nozzle 410 that increases flow velocity as the fluid enters the reservoir 402. A fluid outlet 408 (also referred to as a fluid sink) provides an exit path for excess fluid in a location at the top of the reservoir 402 that prevents chiplets 100 from being caught in the fluid pumping circuit. For example, separation between a bottom and top of the reservoir 402 may be sufficient to prevent the chiplets 100 from flowing into the fluid outlet 408. Other means may be used to prevent capture of chiplets 100 into the pumping system, e.g., a mesh or grate.

The flow induced in the reservoir via the nozzle 410 causes some chiplets 100 to be guided down the delivery surfaces 404 to be placed onto the assembly surface 102. The nozzle-driven flow will also cause other chiplets to be agitated within the reservoir 402, e.g., due to secondary flows that are result from the curved sides of the reservoir 402. The autoloader system 400 may include other features not shown here, such as a means for adding new chiplets 100 to replenish the reservoir 402.

In embodiments described above, the micro-assembler 101 provides metering and selection functions, e.g., selecting and pulling chiplets down to the assembly surface based on right side down orientation. The autoloader is configured to feed the system with a stream of chiplets with random orientation at a controllable average rate. Other autoloader embodiments may be capable of providing a metering function or even preliminary assembly ordering before feeding chiplets to the assembly surface. These will be referred to herein as "organizing autoloaders," in that they may perform some sort of organization of the chiplets before delivering them to the assembly surface. In such a case, the micro assembler program may not need to handle a chiplet feed that is entirely random, e.g., chiplet location and/or orientation may be partially or fully organized by the autoloader instead.

Figure 5:
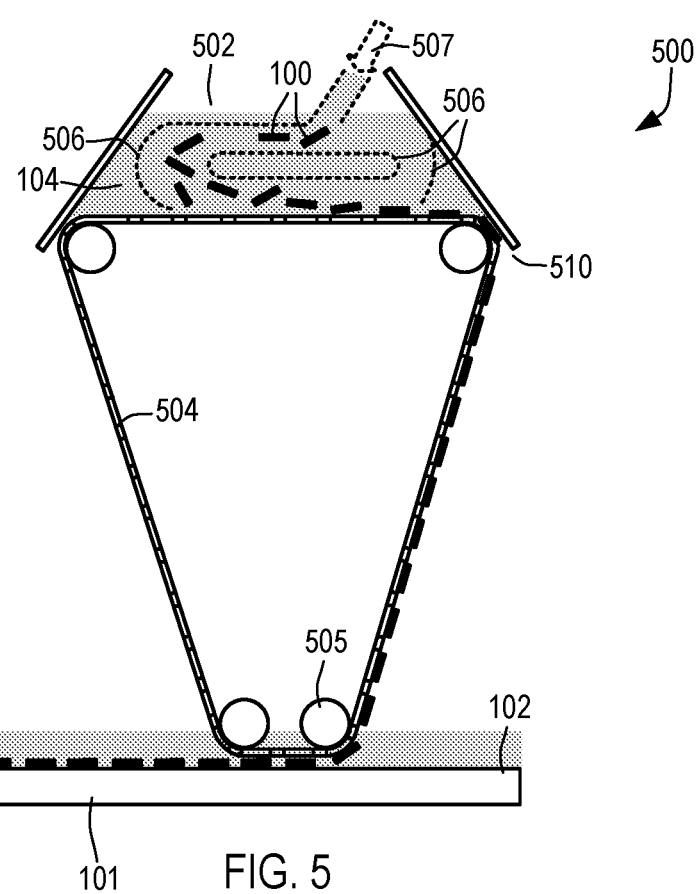
FIG. 5 is a side view of a chiplet organizing autoloader according to an example embodiment.

In FIG. 5, a diagram shows an organizing autoloader 500 according to an example embodiment. Chiplets 100 are suspended in a dielectric fluid 104 such as isopar and agitated within a reservoir 502 to suspend and separate the chiplets 100. As indicated by structures 506 and arrow 507, a forced flow can optionally be used to circulate chiplets 100 through a specific flow path rather than generally agitating fluid 104 within an open volume of the reservoir 502. A belt 504, e.g., a seamless belt, attracts and binds chiplets 100 as it passes through the reservoir 502. The dwell time of the belt 504 in the source bath is set long enough to allow most or all of the attractive sites/features on the belt 504 to be filled. Two possible versions of such a belt are shown in the FIGS. 6 and 7.

Figure 6:
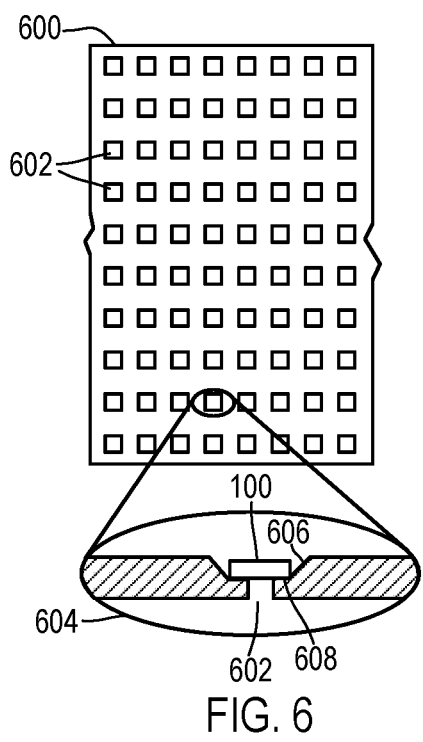
FIGS. 6 and 7 are plan views of autoloader belts according to example embodiments.

In FIG. 6, plan view shows a belt 600 according to one or more embodiments. The belt 600 has an array of shaped holes 602 through which the suspending flux is pumped. When a chiplet 100 approaches a hole it is pulled closer and centered by the flow field. The holes 602 can include depressions shaped with a beveled longitudinal profile (see cross-section view inset 604) to guide a chiplet 100 to its seated position. The shape of the depression can correspond to an outline of the chiplet 100 to help ensure correct orientation on the plane of the belt 60. As seen in the inset 604, holes 602 can have a vertical cross section with beveled side walls 606 and a flat, open base 608. In this way a rectangular chiplet 100 can be seated levelly and centered on the hole 602. Another version of a belt can be similar to the illustrated belt 600, but only with embossed concave dimples/depressions (e.g., similar to beveled side walls 606 and base 608), but not through holes. The chiplets 100 will be trapped within the dimples by gravity and fluid flow, and agitation of fluid and/or vibration of the belt can assist in trapping of chiplets in the depressions.

Figure 7:
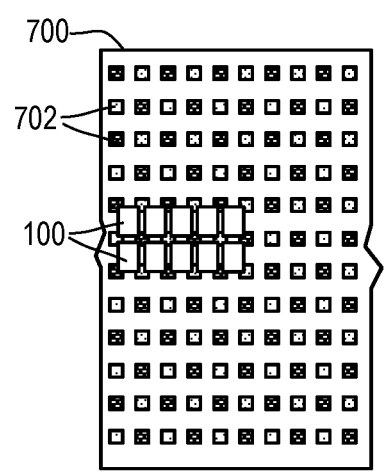

In FIG. 7, plan view shows a belt 700 according to one or more embodiments. The belt 700 uses electrostatic or dielectrophoretic potential wells to attract and bind chiplets 100. These wells can be created by field generating elements 702 that are differently activated as indicated by the different shading. Using these field generating elements 702, the chiplets 100 can be bound in a right side down orientation. For example, if chiplets 100 are provided with zeta potential variants, which charge differentially in the fluid or have electrets formed on one surface, then the field patterns will attract only chiplets in the correct orientation and repel others. Such charge patterns can also be utilized to control in-plane orientation and/or chip type selection by tailoring attractive field and charge patterns.

Note that the embodiments shown in FIGS. 6 and 7 can be combined, e.g., both field generation elements 702 and holes 602 can be used. For example, holes 602 and physical alignment features such as beveled side walls 606 and base 608 can be centered between four field generation elements 702, e.g., directly under the chiplets 100 shown in FIG. 7. In other embodiments, the beveled side walls 606 and base 608 (or other concave features) can be used as depressions located between the field generation elements 702 but without through holes.

In reference again to FIG. 5, filled rows of chiplets 100 are carried around and into the dielectric fluid covered micro assembler 101 where they are released from the belt 504 (e.g., by pressure or electrostatic repulsion) and transferred electrostatically into the receiving fields of the assembler array. Each transferred row of chiplets is translated away from the "nip" as the next row of chiplets arrives. Generally, the nip is the line of closest approach between the belt 504 and assembly surface 102, e.g., where the assembly surface 102 is tangent to a belt roller 505. The transferred chiplets 100 release from the nip onto the assembly surface 102 where they are translated (to the left in this figure) by the assembler 101 to make room for the next row of chiplets from the autoloader belt 504. The distance between rows on the loader belt 504 can be considerably greater than the pitch on the assembly surface 102.

Note that when using any of the belt-type autoloaders described as above, there may be some instances where chiplets 100 are misaligned or missing when being carried out of the reservoir 502. Because the micro assembler 101 is capable of rearranging chiplets 100 'on-the-fly,' high precision, high yield performance of the autoloader may not be necessary and therefore it may be acceptable for the occasional missing or misaligned chiplet. The micro assembler software program can use the dynamic actuator array to manipulate the chiplets 100 to the final high accuracy locations with high yield.

Figure 8:
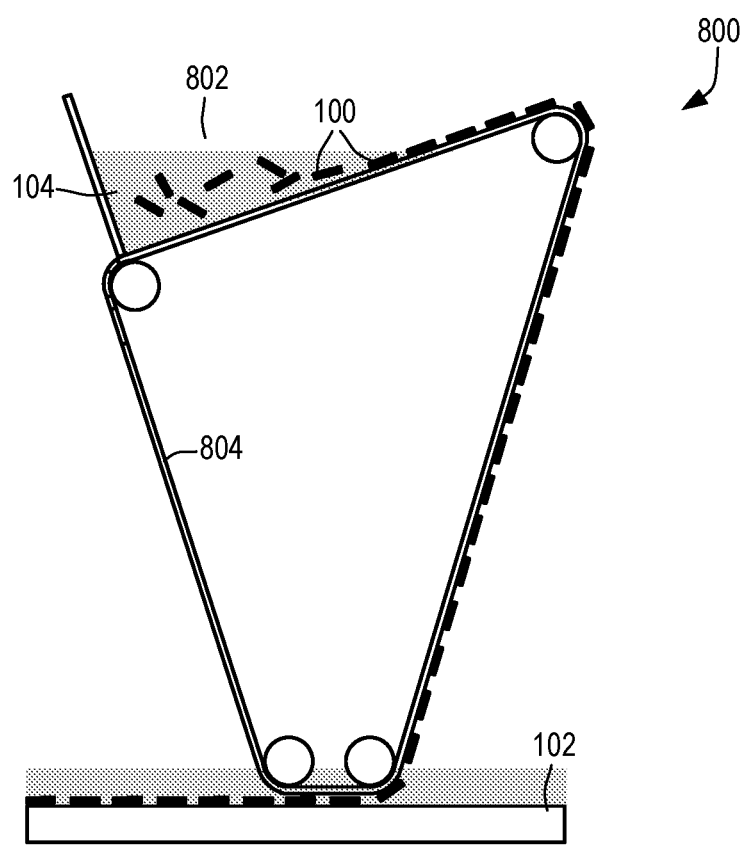
FIG. 8 is a side view of a chiplet organizing autoloader according to another example embodiment.

In FIG. 8, a diagram shows an organizing autoloader 800 according to another example embodiment. This uses a belt 804 that may be similar to any previously described embodiment. The belt 804 attracts chiplets 100 that are suspended or circulated in a reservoir 802. The belt 804 exits the top of the reservoir such that the belt 804 will drag the roughly metered and assembled chiplet array out of the surface of the fluid 104. The fluid surface tension will form a natural "brush" like interaction to help the assembly of chiplets 100 into belt alignment/attraction features. For the previous configuration that the belt exit at the bottom of the reservoir, a soft silicone blade could be used (e.g., at region 510 in FIG. 5) to provide a similar brush action and prevent excess fluid drain.

Figure 9:
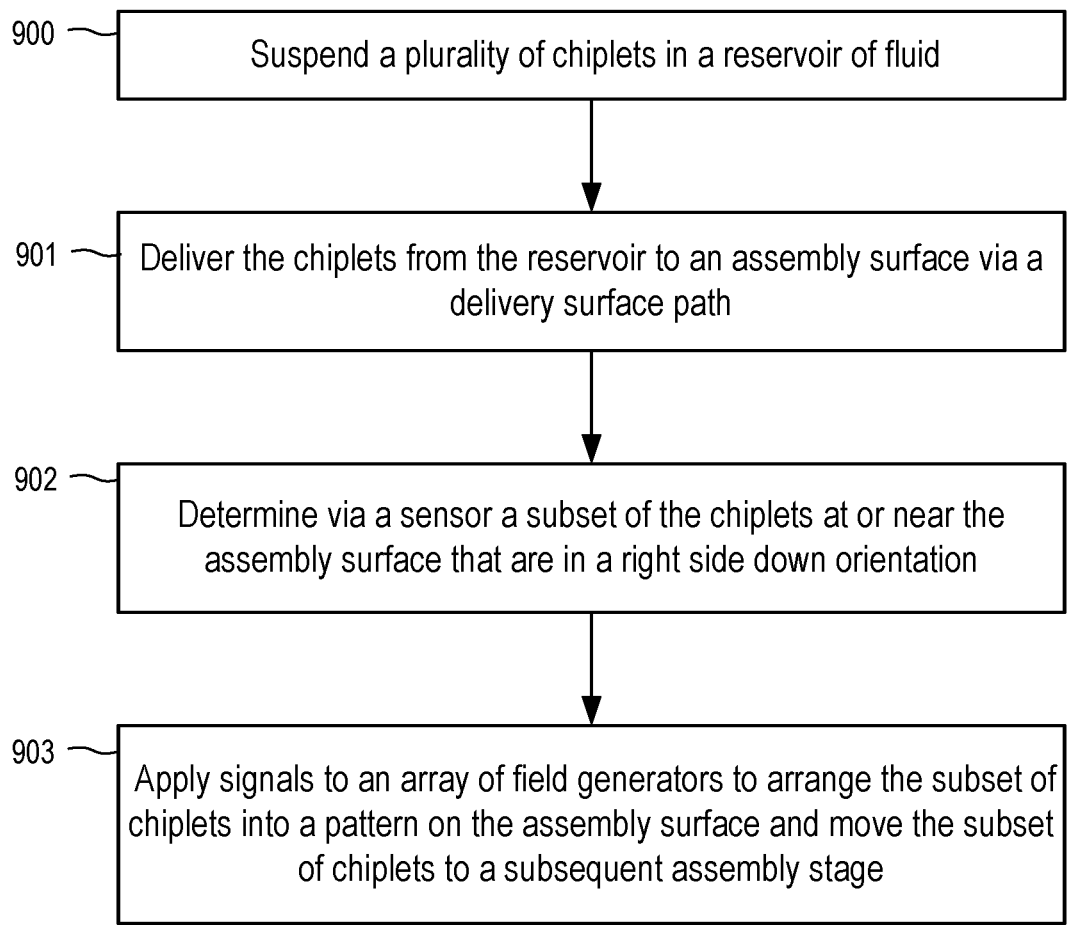
FIGS. 9 and 10 are flowcharts of methods according to example embodiments

In FIG. 9, a flowchart shows a method according to an example embodiment. The method involves suspending 900 a plurality of chiplets in a reservoir of fluid, e.g., by inducing a flow in the reservoir. The chiplets are delivered 901 from the reservoir to an assembly surface via a delivery surface path, e.g., a belt, a flow channel, the outer surface of a cylinder, etc. A sensor determines 902 that a subset of chiplets at or near the assembly surface are arranged in a right side down orientation. In response, signals are applied 903 (e.g., via a controller) to arrange the subset of chiplets into a pattern on the assembly surface and move the subset of chiplets to a subsequent assembly stage, e.g., being picked up from the assembly surface by a transfer head. The arranging of the subset of chiplets may include using the field generators to remove the subset of chiplets from the delivery surface and/or using the field generators to move chiplets not in the subset (e.g., those chiplets in a wrong side down orientation) in a direction different than that of the subsequent assembly stage.

Figure 10:
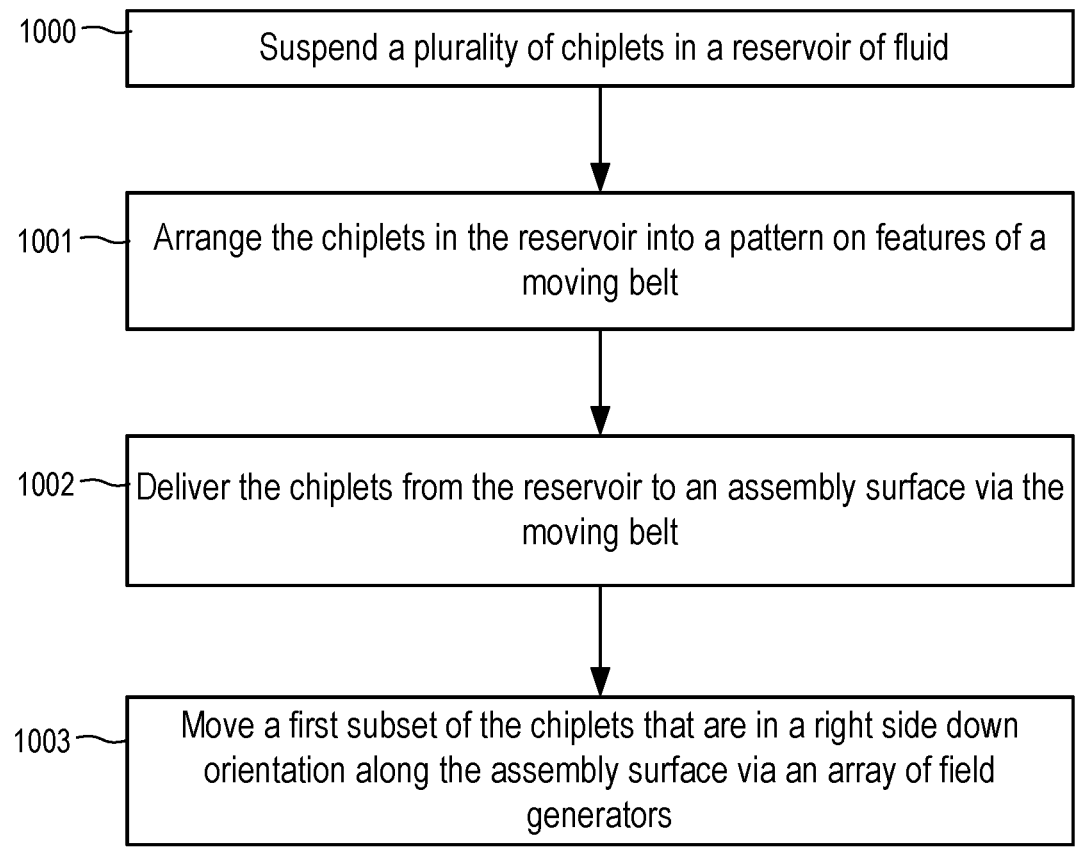

In FIG. 10, a flowchart shows a method according to another example embodiment. The method involves suspending 1000, a plurality of chiplets in a reservoir of fluid, e.g., by inducing a flow in the reservoir. The chiplets are arranged 1001 in the reservoir into a pattern on features (e.g., electrodes, holes, dimples) of a moving belt. The moving belt delivers 1002 the chiplets from the reservoir to an assembly surface. A first subset of the chiplets that are in a right side down orientation are moved 1003 along the assembly surface via an array of field generators.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The use of numerical ranges by endpoints includes all numbers within that range (e.g., 1 to 5 includes 1, 1.5, 2, 2.75, 3, 3.80, 4, and 5) and any range within that range.

The various embodiments described above may be implemented using circuitry, firmware, and/or software modules that interact to provide particular results. One of skill in the arts can readily implement such described functionality, either at a modular level or as a whole, using knowledge generally known in the art. For example, the flowcharts and control diagrams illustrated herein may be used to create computer-readable instructions/code for execution by a processor. Such instructions may be stored on a non-transitory computer-readable medium and transferred to the processor for execution as is known in the art. The structures and procedures shown above are only a representative example of embodiments that can be used to provide the functions described hereinabove.

Terms related to orientation, such as "top," "bottom," "side," and "end," are used to describe relative positions of components and are not meant to limit the orientation of the embodiments contemplated. For example, an embodiment described as having a "top" and "bottom" also encompasses embodiments thereof rotated in various directions unless the content clearly dictates otherwise. Generally such terms are used herein to describe an orientation shown in the figure, and unless otherwise specified, are not meant to limit orientation of physical embodiments, e.g., relative to the Earth's surface.

The foregoing description of the example embodiments has been presented for the purposes of illustration and description. It is not intended to be exhaustive or to limit the embodiments to the precise form disclosed. Many modifications and variations are possible in light of the above teaching. Any or all features of the disclosed embodiments can be applied individually or in any combination and are not meant to be limiting, but purely illustrative. It is intended that the scope of the invention be limited not with this detailed description, but rather determined by the claims appended hereto.

The invention claimed is:

1. A system comprising:
 a reservoir storing a supply of chiplets suspended in a suspension fluid, each of the chiplets comprising a bottom major surface that defines a right side down orientation;
 a delivery surface forming a path to deliver the chiplets from the reservoir to an assembly surface;
 a sensor that identifies a first subset of the chiplets having the respective bottom surfaces facing the assembly surface; and
 a micro assembler that arranges the first subset of the chiplets in a pattern on the assembly surface and moves the first subset of chiplets towards a subsequent assembly stage, the micro assembler comprising an array of field generators fixed relative to the assembly surface that move the first subset of the chiplets along the assembly surface in response to signals applied to each of the field generators.

2. The system of claim 1, wherein the delivery surface comprises an outer surface of a rotating cylinder, the chiplets being held on the outer surface with a layer of the suspension fluid.

3. The system of claim 2, wherein the sensor identifies the first subset of the chiplets while the first subset is attached to the outer surface of the rotating cylinder proximate the assembly surface, the field generators activated to pull the first subset of the chiplets off the outer surface of the cylinder and onto the assembly surface.

4. The system of claim 1, wherein the delivery surface comprises a fluid flow path that encompasses a forced flow of the suspension fluid, the fluid flow path being fixed relative to the assembly surface.

5. The system of claim 4, wherein the fluid flow path comprises a Venturi jet.

6. The system of claim 4, wherein the fluid flow path comprises a supply outlet on a first bottom side of the reservoir, the reservoir comprising:
a fluid inlet on a second bottom side of the reservoir that provides a pressurized flow into the reservoir causing the forced flow through the supply outlet; and
a fluid outlet on a top of the reservoir that allows pressurized fluid to leave the reservoir, a separation between a bottom and top of the reservoir sufficient to prevent the chiplets from flowing into the fluid outlet.

7. The system of claim 1, wherein the sensor identifies a second subset of the chiplets having the respective bottom surfaces facing away from the assembly surface, the micro assembler moving the second subset of the chiplets away from the subsequent assembly stage.

8. The system of claim 7, wherein the second subset of the chiplets are directed back to the reservoir.

9. A system comprising:
a reservoir storing a supply of chiplets suspended in a suspension fluid, each of the chiplets comprising a bottom major surface that defines a right side down orientation;
a moving belt that delivers the chiplets from the reservoir to an assembly surface, the moving belt comprising features that arranges the chiplets in a pattern; and
a micro assembler that moves a first subset of the chiplets that are in the right side down orientation to a subsequent assembly stage.

10. The system of claim 9, wherein the features of the moving belt comprise an array of depressions arranged in the pattern, each of the depressions having a shape that corresponds to an outline of the chiplets.

11. The system of claim 10, further comprising holes in the depressions through which the suspension fluid is pumped causing the chiplets to flow into the depressions.

12. The system of claim 11, wherein the depressions comprise bevels that guide the chiplets to a seated position.

13. The system of claim 9, wherein the moving belt comprises electrostatic or dielectrophoretic potential wells that attract and bind the chiplets into the pattern.

14. The system of claim 13, wherein the chiplets comprise zeta potential differences between the bottom major surface and opposed top facing surfaces, the electrostatic or dielectrophoretic potential wells attracting only the first subset of the chiplets with the bottom major surfaces in the right side down orientation and repelling a second subset of the chiplets with the bottom major surfaces not in the right side down orientation.

15. The system of claim 9, wherein the micro assembler comprises an array of field generators fixed relative to the assembly surface that move the chiplets along the assembly surface in response to signals applied to each of the field generators.

16. The system of claim 9, wherein the reservoir agitates the chiplets in the suspension fluid causing the chiplets to be placed in the moving belt.

17. The system of claim 9, wherein the reservoir comprises a fluid circulation path with a forced flow that causes the chiplets to pass across the moving belt.

18. The system of claim 9, wherein the moving belt comprises a seamless belt.

19. The system of claim 9, wherein the chiplets are moved from the moving belt to the assembly surface via pressure or electrostatic repulsion.

* * * * *